United States Patent [19]
Park et al.

[11] Patent Number: 5,121,356
[45] Date of Patent: Jun. 9, 1992

[54] WRITE DRIVER HAVING A PRECHARGING MEANS

[75] Inventors: Yong-bo Park, Kyunggi; Byeong-yun Kim, Seoul, both of Rep. of Korea

[73] Assignee: Samsung Electronics, Co., Ltd., Suwon, Rep. of Korea

[21] Appl. No.: 578,768

[22] Filed: Sep. 6, 1990

[30] Foreign Application Priority Data

Jun. 30, 1990 [KR] Rep. of Korea .................... 90-9877

[51] Int. Cl.$^5$ ............................................... G11C 11/40
[52] U.S. Cl. .............................. 365/203; 365/189.01; 365/189.11
[58] Field of Search ...................... 365/189.01, 189.06, 365/189.09, 203, 189.11

[56] References Cited

U.S. PATENT DOCUMENTS 4,823,319  4/1989  Pfennings .................... 365/189.01

Primary Examiner—Terrell W. Fears
Attorney, Agent, or Firm—Morgan & Finnegan

[57] ABSTRACT

A write driver of a semiconductor memory device is disclosed which includes: a data input incorporating a noninverted data input portion and an inverted data input portion for buffering an inputted data signal and an inverted data signal in response to write enable signal; a pulse generator generating a first control pulse signal in response to a state transition of the data signal or inverted data signal and a phase-inverted second control pulse signal of the first control pulse signal in response to an inverted write enable signal; a transmitter for transmitting the inverted and noninverted data which have been buffered to a pair of data lines in response to the first control pulse signal; and a precharger for precharging the pair of data lines in response to the second control pulse signal. In performing a write operation, the write driver precharges the pair of data lines after writing data in the memory cell so that, in performing the subsequent read operation, it can increase the operating speed and reduce noise generated during precharge of the data lines due to the decrease of the voltage swing of the data lines.

11 Claims, 4 Drawing Sheets

WRITE DRIVER HAVING A PRECHARGING MEANS

FIELD OF THE INVENTION

The present invention relates to a semiconductor memory device, and more particularly to a write driver of a semiconductor memory device having a precharging means.

BACKGROUND OF THE INVENTION

There has been an increased need for high speed of operation made possible by the increased integration density of semiconductor memory devices without the increased noise generally accompanying such high speed operations.

One method proposed to increase the operation speed of the device is an ATD (Address Transition Detection) technology, wherein clocks are generated internally by detecting changes of address or control signals rather than being supplied from the outside. More specifically, since a 16 read/write operation is performed after precharging of data lines with a predetermined voltage for the operation of read/write using internal pulse, increased speed may be achieved.

However, when precharging data lines, it takes a long period of time to charge up to the power supply voltage (Vcc) from the ground voltage (Vss), and noise is generated inside the chip during precharging of the data lines having a large voltage swing. The noise thus gernerated has a negative effect on the operation of the device.

To solve this problem, a method for reducing the swing of the signal of the data lines has been proposed as described on page 1214 of the IEEE JOURNAL OF SOLIDSTATE CIRCUITS VOL. 24, NO. 5, OCTOBER 1989. This method is effective in the case of performing a continuous read operation, but still is not satisfactory in connection with the operation speed and noise reduction when the read operation is carried out after a write operation. More specifically, since a write driver allots the respective data lines with a ground voltage (Vss) and a power supply voltage (Vcc), or alternatively with a ground voltage and a power supply voltage minus a threshold voltage of a NMOS transistor (Vcc-Vtn) during the performance of a write operation, it takes a long period of time to precharge up to the power supply voltage (Vcc) or the power supply voltage minus the threshold voltage of NMOS transistor (Vcc − Vtn) required when a data line is precharged to perform a read operation after a write operation. Such a long period of time gives rise to noise.

To explain this kind of conventional method in greater detail, reference will be particularly made to FIG. 1 wherein another conventional write driver of a SRAM device is illustrated.

The write driver is connected with a pair of data input terminals DL and DLB which are respectively coupled to a pair of internal data lines BL and BLB, which are in turn connected to a memory cell MC through input/output gates IOG. The write driver includes a noninverted data driver 1 which noninverts the data input signal DIN applied to the data input terminals from outside in response to the write enable signal WE and includes an inverted data driver 2 which inverts the data input signal DIN in response to the write enable signal WE.

The noninverted data driver 1 includes a NAND gate NAND1 generating a signal A by inverting the data input signal DIN in response to the write enable signal WE; a NAND gate NAND2 and inverter INV2 generating a signal B by noninverting the inverted data input signal DINB which has been generated by inverting the data input signal DIN through an inverter INV1; a pull-up transistor MN1, a gate of which receives the signal A and a drain of which is connected to the noninverted data line DL; and a pull-down transistor MN2, a gate of which receives the signal B and a drain of which is connected to the noninverted data line DL.

The inverted data driver 2 includes a NAND gate NAND3 generating a signal C by inverting the inverted data input signal DINB in response to the write enable signal WE; a NAND gate NAND4 and inverter INV3 generating a signal D by noninverting the data input signal DIN in response to the write enable signal WE; a pull-up transistor MN3, a gate of which receives the signal C and a drain of which is connected to the inverted data line DLB; and a pull-down transistor MN4, a gate of which receives the signal D and a drain of which is connected to the inverted data line DLB.

The operation of the conventional write driver illustrated in FIG. 1 will be explained with reference to FIG. 2. In writing data into a memory cell, when a write enable signal WE becomes level "H" (i.e., high) and a data input signal DIN falling down to "L" (i.e., low) from "H" is input, an inverted data input signal DINB rising up to "H" from "L" is generated through the inverter INV1. The noninverted data input signal DIN together with write enable signal WE generate inverted signal A through NAND gate NAND1 and the inverted data input signal DINB together with write enable signal WE generate noninverted signal B though NAND gate NAND2 and inverter INV2. Here, the signals A and B rise up to "H" from "L". The signal A turns the pull-up transistor MN1 OFF and the signal B turns the pull-down transistor MN2 ON, causing the noninverted data line DL to be in a state of ground voltage Vss by pulling down. The inverted data input signal DINB together with write enable signal WE generate inverted signal C through a NAND gate NAND3, and noninverted data input signal DIN together with write enable signal WE generate noninverted signal D through NAND gate NAND4 and inverter INV3. Here, the signals C and D fall down to "L" from "H". The signal C turns the pull-up transistor MN3 ON and the signal D turns the pull-down transistor MN4 OFF, causing the inverted data line DLB to be in a state of power supply voltage Vcc by pulling up.

When a write enable signal WE falls down to "L" to perform a read operation after the write operation, signal A remains at "H", signal B changes to "L" from "H", signal C changes to "H" from "L" and signal D remains at "L". Accordingly, transistors MN1, MN2, MN3 and MN4 are all turned OFF, and a write driver and a pair of data lines are electrically separated.

When precharging a pair of data lines to read out data in the memory cell, a pair of data lines are allotted with the power supply voltage Vcc and the ground voltage Vss, and thus a long period of time is required to precharge the data. As result, noise is generated for precharging the data lines having a large swing, leading to a negative effect on device operation.

SUMMARY OF THE INVENTION

Accordingly, an object of the present invention is to provide an improved write driver which increases speed in a subsequent read operation by precharging data lines after data is written into a memory cell during the performance of a write operation.

Another object of the present invention is to provide a write driver wherein swing of voltage in the data lines is reduced, resulting in reduction of noise in precharging the data lines to perform a subsequent read operation, which noise reduction is accomplished by precharging data lines with a value Vcc−Vtn after data is written into a memory cell during the performance of a write operation.

To accomplish the above objects a write driver according to the present invention includes: a data input means for noninverting or inverting input data in response to a write enable signal; a pulse generating means for generating a first control pulse signal by the state transition detection of the noninverted data and the state transition detection of the inverted data and a second control pulse signal generated by phase-inverting the first control pulse signal in response to an inverted write enable signal; a transmission means for transmitting data to a pair of data lines in response to the first control pulse signal; and a precharging means for precharging the a pair of data lines in response to the second control pulse signal.

BRIEF DESCRIPTION OF THE DRAWINGS

A preferred embodiment of the present invention will now be described with reference to the accompanying drawings, wherein.

DESCRIPTION OF THE PREFERRED EMBODIMENT

Figure 1:
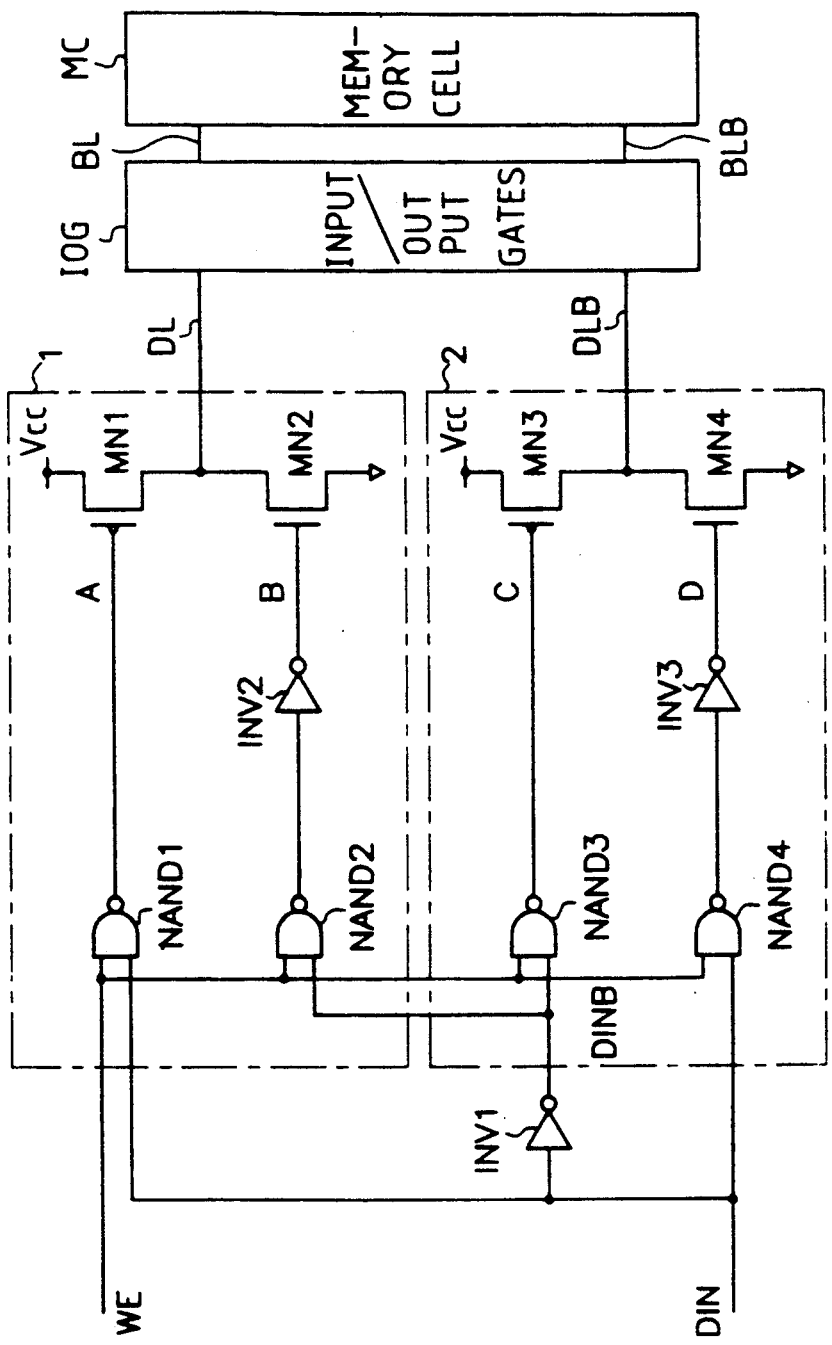
FIG. 1 is a circuit diagram of a prior write driver.
Figure 2:
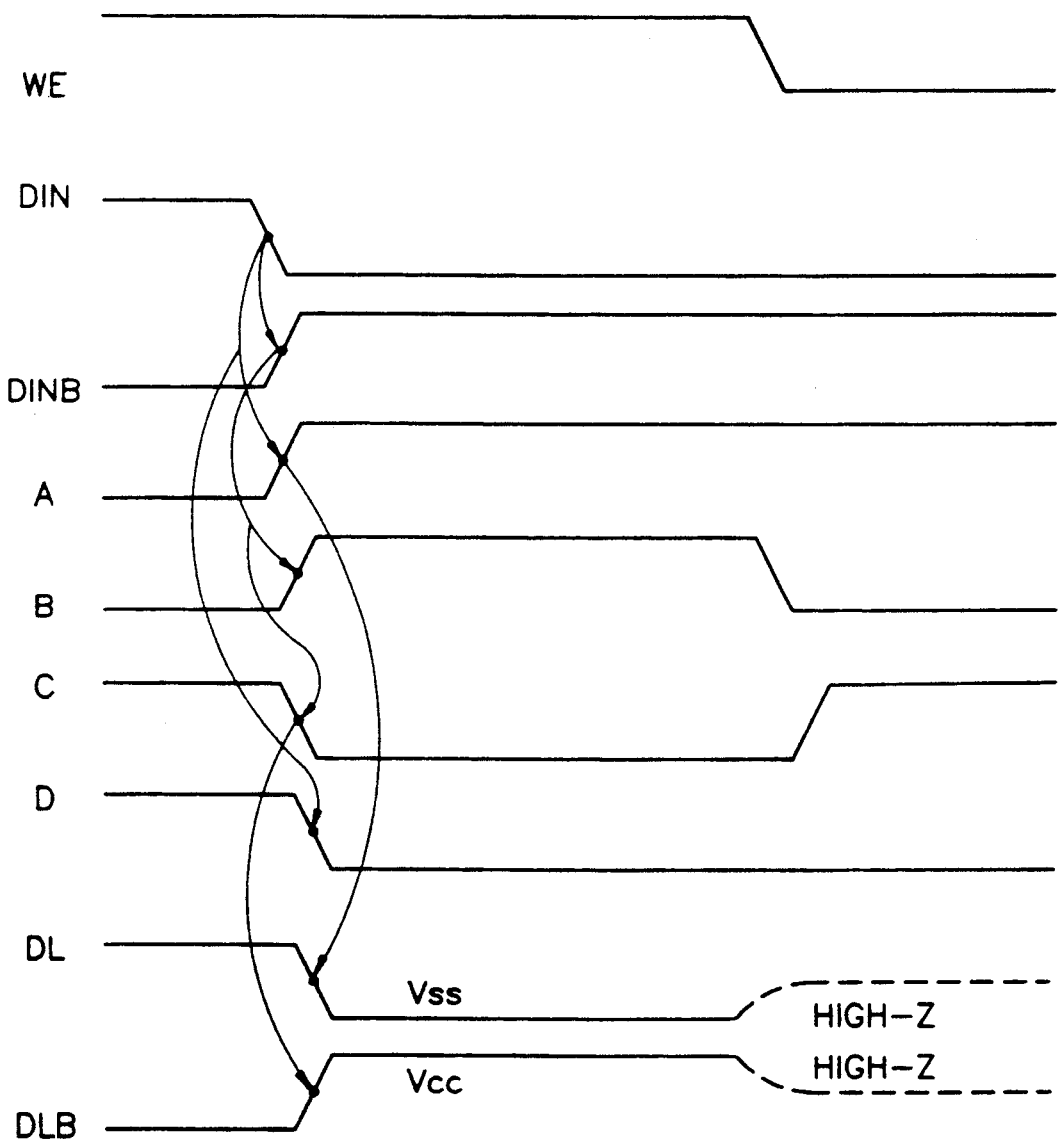
FIG. 2 is a timing diagram exemplifying the operation of the device of FIG. 1.
Figure 3:
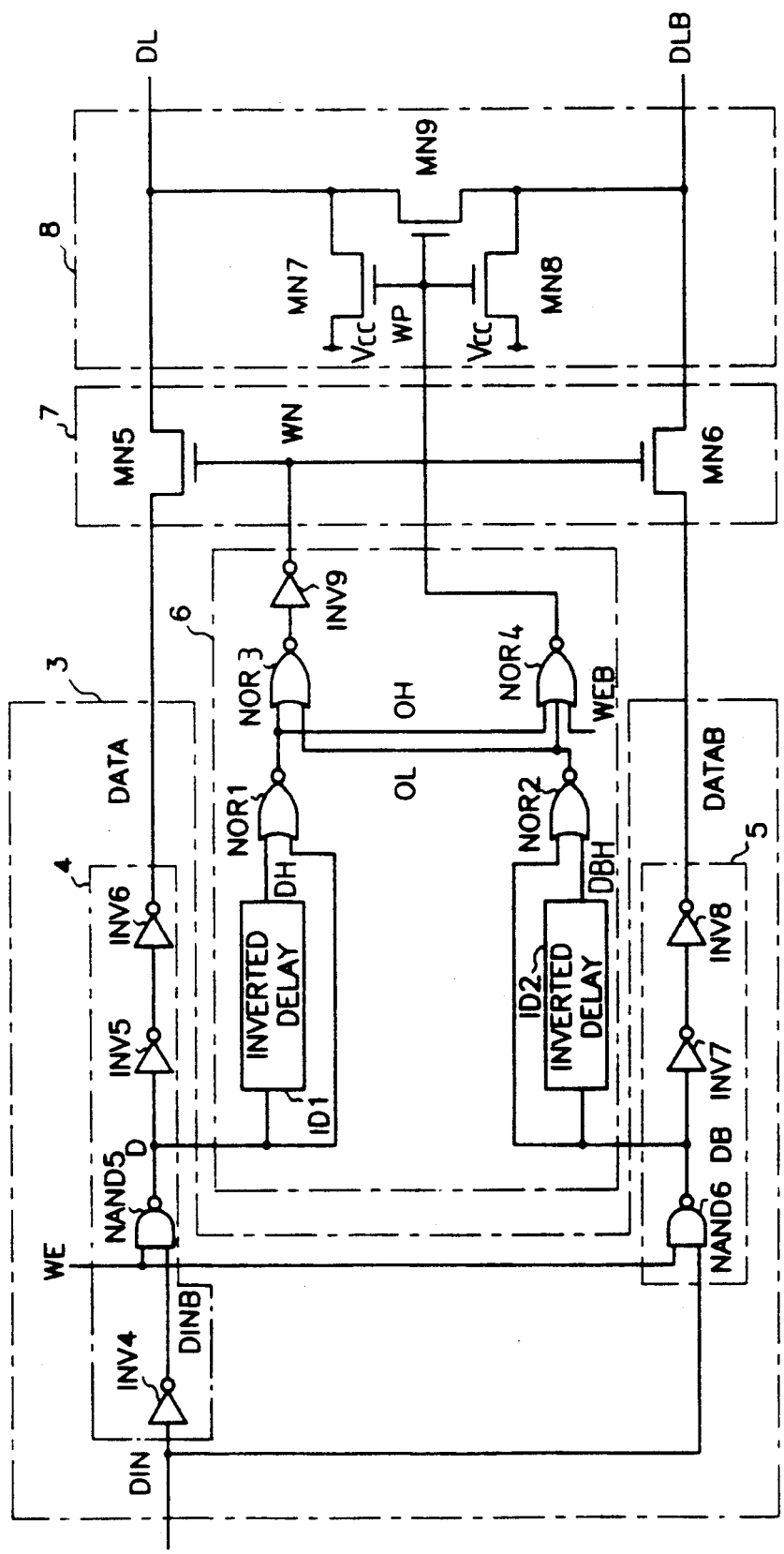
FIG. 3 is a circuit diagram of an embodiment of the present invention.

Referring to FIG. 3, a write driver of the present invention includes a data input means 3, a pulse generating means 6, a transmission means 7 and a precharging means 8, and is connected between a data input terminal (not shown) supplied with a data signal from the outside and a pair of internal data lines connected to a memory cell for storing the data signal.

The data input means 3 includes a noninverted data input portion 4 and an inverted data input portion 5. The noninverted data input portion 4 incorporates an inverter INV4 outputting an inverted data input signal DINB after inverting a data input signal DIN, a NAND gate NAND5 outputting a data signal D after inverting an inverted data input signal DINB in response to a write enable signal WE, and inverters INV5 and INV6 generating a buffered data signal DATA after inputting a data signal D. The inverted data input portion 5 incorporates a NAND gate NAND 6 outputting an inverted data signal DB after inverting a data input signal in response to a write enable signal WE and inverters INV7 and INV8 generating a buffered inverted data signal DATAB after inputting an inverted data signal DB.

The pulse generating means 6 includes a first inverted delay circuit ID1 outputting an inverted delay data signal DH after inverting and delaying a noninverted data signal D, and a first detector incorporating a NOR gate NOR1 which detects a falling transition of data DIN after receiving the noninverted data signal D and the inverted delay data signal DH and outputs a pulse signal OH having a predetermined pulse width corresponding to the delayed time. The pulse generating means 6 further includes a second inverted delay circuit ID2 outputting an inverted delay data signal DBH after inverting and delaying the inverted data signal DB, and a second detector incorporating a NOR gate NOR2 which detects a rising transition of a data DIN after receiving the inverted data signal DB and inverted delay data signal DBH and outputs a pulse signal OL having a predetermined pulse width corresponding to the delayed time. A NOR gate and an inverter, NOR3 and INV9 respectively, output a first control pulse signal WN after receiving the pulse signals OL and OH, and a NOR gate NOR4 outputs a second control pulse signal WP after receiving the pulse signals OL and OH and an inverted write enable signal WEB.

The transmission means 7 includes nMOS transistors MN5 and MN6, gates of which receive the first control pulse signal WN, which is an output of the inverter INV9. The drains of nMOS transistors MN5 and MN6 are connected to the output of inverters INV6 and INV8 respectively and the sources of nMOS transistors MN5 and MN6 are connected to a pair of data lines DL and DLB respectively.

The precharging means 8 includes three nMOS transistors MN7, MN8 and MN9, nMOS transistors MN7 and MN8 being provided for precharging and nMOS transistor MN9 for equalizing. The respective gates of transistors MN7, MN8 and MN9 are supplied with a second control pulse signal WP which is the output of the NOR gate NOR4 and the source of the transistor NM7 and the drain of transistor MN9 are connected to the noninverted data line DL. The sources of the transistors NN8 and MN9 are connected to the inverted data line DLB and the drains of the transistors MN7 and MN8 are supplied with a power source voltage (Vcc).

Figure 4:
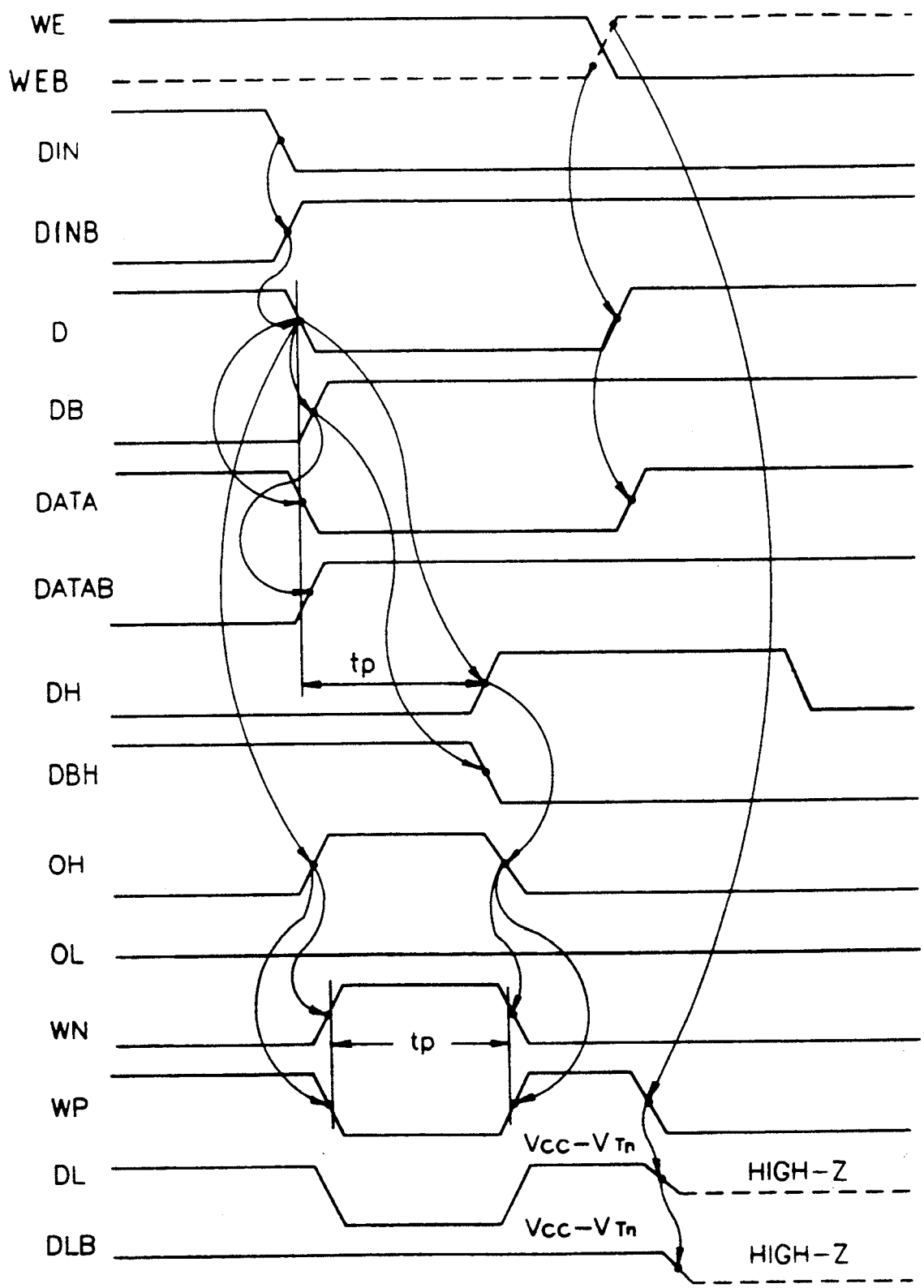
FIG. 4 is a timing diagram exemplifying the operation of the device of FIG. 3.

The operation of the circuit shown in FIG. 3 will be explained with reference to the timing diagram shown in FIG. 4.

In writing data into the memory cell, when the write enable signal WE rises up to "H" and the data input signal DIN changing from level "H" to level "L" is input, the inverted data input signal DINB changing from "L" to "H" through the inverter INV4 is generated. The inverted data input signal DINB is inverted through the NAND gate NAND5 and then generates signal D changing from "H" to "L". The data input signal DIN is inverted through the NAND gate NAND6 and then generates a signal DB changing from "L" to "H". The signal D is buffered through inverters INV5 and INV6 and then generates the noninverted data signal DATA changing from "H" to "L". The signal DB is buffered through inverters INV7 and INV8 and then generates an inverted data signal DATAB changing from "L" to "H". Also, the signal D is inverted by the first inverted delay circuit ID1 and delayed for a time tp and then generates signal DH changing from "L" level to "H" level. The signal DB is inverted by the second inverted delay circuit ID2 and delayed for a time tp and then generates signal DBH changing from "H" level to "L" level. Here., the time tp is set to a period long enough to write data into the memory cell by the first inverted delay circuit ID1 and the second inverted delay circuit ID2.

The signals D and DH are input to the NOR gate NOR1 to detect a falling transistion of signal D and a rising transition of signal DH and generate a positive pulse signal OH having a pulse width of time tp. The nor gate NOR1 outputs a signal of Level "L" when signal D rises up to "H" from "L". The signals DB and DBH are inputted to a NOR gate NOR2 to detect a falling transition of signal DB and a rising transition of signal DBH and generate positive pulse signal OL having a pulse width of time tp. The NOR gate NOR2 outputs signal OL of level "L" when signal DB rises up to "H" from "L". Namely the first inverted delay circuit ID1 and the NOR gate NOR1 as well as the second inverted delay circuit ID2 and the NOR gate NOR2 are provided to detect transition from "H" to "L" of the signals D and DB respectively.

The NOR gate NOR3 and the inverter INV9 generate a positive first control pulse signal WN having a pulse width tp after receiving the signals OL and OH. Also, a NOR gate NOR4 generates a phase-inverted negative second control pulse signal WP of a first control pulse signal WN after receiving the signals OL and OH and the inverted write enable signal WEB of level "L". When the first control pulse signal WN rises up to "H" from "L", transistors MN5 and MN6 are turned ON and then a data signal DATA of level "L" is transmitted to the data line DL and an inverted data signal DATAB of level "H" is transmitted to an inverted data line DLB. Here, the inverted data signal of "H" is transmitted in a reduced value (Vcc−Vtn) by a transistor MN6 and the pulse width of a first control pulse signal WN serves as a mechanism for controlling data transmission time. Next, when the first control pulse signal WN falls down to "L" from "H", transistors MN5 and MN6 are turned OFF and then the data DATA and DATAB as well as the pair of data lines DL and DLB are electrically separated.

When the second control pulse signal WP falls down to "L" from "H", the precharge transistors MN7 and MN8 and the equalized transistor MN9 are turned OFF and then precharge means MN7, MN8 and MN9 as well as the pair of data lines DL and DLB are electrically separated. After the data DATA and DATAB are transmitted to the pair of data lines DL and DLB respectively, when the second control pulse signal WP rises up to "H" from "L", the equalized transistor MN9 is turned ON. At this point, the pair of data lines DL and DLB are equalized to an equivalent potential and precharge transistors MN7 and MN8 are turned ON, thus precharging the pair of data lines with the voltage of Vcc−Vtn.

The write driver according to the present invention electrically separates the pair of data lines DL and DLB and data input means 3 after the data DATA and DATAB has been written in the memory cell and then precharges the pair of data lines DL and DLB with the voltage of Vcc−Vtn. This occurs even where a data input signal is changed or only the inverted write enable signal WEB falls down to "L" from "H" without any change of the data input signal DIN.

In reading out data from the memory cell after precharging of the pair of data lines DL and DLB, when write enable signal WE falls down to "L", the inverted write enable signal WEB rises to "H", thus turning off the transmission means MN5 and MN6 as well as the precharging means MN7, MN8 and MN9. At this point, the pair of data lines DL and DLB, as well as the write driver, are electrically separated. Further, in precharging the data lines, precharge is performed not from Vss but from Vcc-Vtn so that precharging time is reduced, speed of the read operation is increased and the voltage swing of data lines is reduced, thereby reducing noise which can give rise to malfunction within the chip.

Accordingly, a write driver of the present invention, in performing a write operation, precharges a pair of data lines after writing data in the memory cell so that, in performing the subsequent read operation, it can increase the operating speed. Further, by decreasing the voltage swing of the data lines, noise generated during precharge of the data lines is reduced.

Many other various embodiments of the present invention may be realized without departing from the spirit and scope of the present invention as defined in the appended claims.

What is claimed is:

1. A write driver of a semiconductor memory device comprising:
   a data input means including a noninverted data input means and an inverted data input means for buffering an inputted data signal and an inverted data signal in response to a write enable signal;
   a pulse generating means generating a first control pulse signal in response to a state transition of said data signal or inverted data signal and a phase-inverted second control pulse signal of said first control pulse signal in response to an inverted write enable signal;
   a transmission means for transmitting said inverted and noninverted data signals which have been buffered to a pair of data lines in response to said first control pulse signal; and
   a precharging means for precharging said pair of data lines in response to said second control pulse signal.

2. A write driver according to claim 1, wherein said transmission means electrically separates said pair of data lines from said data input means immediately after transmitting said data signals to said pair of data lines by said first control pulse signal.

3. A write driver according to claim 1, wherein said precharging means equalizes and precharges said pair of data lines immediately after transmitting said data signals to said pair of data lines by said second control pulse signal.

4. A write driver according to claim 2, wherein said transmission means electrically separates said data input means and said pair of data lines immediately after transmitting said data signals to said pair data lines when said data input signal undergoes a state transition or said write enable signal rises up to "H" from "L" without change of said data input signal.

5. A write driver according to claim 3, wherein said precharging means precharges said pair of data lines after transmitting said data signals to said pair of data lines when said data input signal undergoes a state transition or said write enable signal rises up to "H" from "L" without change of said data input signal.

6. A write driver according to claim 5, wherein said pulse generating means comprises:
   a first detector for detecting a falling transition of said data signal;
   a second detector for detecting a rising transition of said data signal;

a first NOR gate and an inverter for generating said first control pulse signal after combining the outputs of said first and second detectors; and a second NOR gate for generating said second control pulse signal after responding to said inverted write enable signal and combining the outputs of said first and second detectors.

7. A write driver according to claim 6, wherein said first and second detectors include an inverted delay means and a NOR gate and generate said first and second detectors having a predetermined pulse width from the state transition of said data signals.

8. A write driver according to claim 7, wherein said predetermined pulse width is set for time enough to complete transmission of data to said pair of data lines.

9. A write driver according to claim 8, wherein said transmission means includes said data input means and two nMOS transistors connected between said pair of data lines and said data input means, respective gates of said nMOS transistors being supplied with said first control pulse signal.

10. A write driver according to claim 9, wherein said precharging means comprises:

a first nMOS transistor having a gate supplied with said second control pulse signal, a drain supplied with a power source voltage and a source connected with said noninverted data line;

a second nMOS transistor having a gate supplied with said second control pulse signal, a drain supplied with said power source voltage and a source connected with said inverted data line; and a third nMOS transistor having a gate supplied with said second control pulse signal, a drain connected with said noninverted data line and a source connected with said inverted data line.

11. A write driver according to claim 10, wherein said transmission means and said precharging means are turned off when performing a read-out operation.

* * * * *